United States Patent
Lopatin

(10) Patent No.: US 6,291,082 B1
(45) Date of Patent: Sep. 18, 2001

(54) METHOD OF ELECTROLESS AG LAYER FORMATION FOR CU INTERCONNECTS

(75) Inventor: Sergey Lopatin, Santa Clara, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/592,164

(22) Filed: Jun. 13, 2000

(51) Int. Cl.[7] ............................. B32B 15/20; H01L 23/52
(52) U.S. Cl. ......................... 428/621; 428/209; 428/670; 428/673; 428/674; 257/750; 257/751; 257/763
(58) Field of Search ........................ 428/620, 621, 428/624, 668, 673, 674, 675, 469, 699, 210, 209, 697, 670; 257/750, 751, 763

(56) References Cited

U.S. PATENT DOCUMENTS

| | | | |
|---|---|---|---|
| 5,824,599 | * | 10/1998 | Schacham-Diamand et al. .. 438/678 |
| 5,969,422 | * | 10/1999 | Ting et al. ......................... 257/762 |
| 6,022,808 | * | 2/2000 | Nogami et al. ..................... 438/694 |
| 6,100,194 | * | 8/2000 | Chan et al. ........................ 438/686 |
| 6,136,707 | * | 10/2000 | Cohen ................................. 438/687 |
| 6,197,688 | * | 3/2001 | Simpson ............................. 438/678 |

OTHER PUBLICATIONS

Silver Metallization for Advanced Interconnects, Manepalli et al., IEEE Transactionson Advanced Packaging, vol. 22, No. 1, Feb. 1999.

* cited by examiner

Primary Examiner—Deborah Jones
Assistant Examiner—Stephen Stein
(74) Attorney, Agent, or Firm—Paul J. Winters

(57) ABSTRACT

A dielectric layer has an opening which communicates with a metal line therebeneath. A layer of silver is deposited over the structure and into the opening, and copper is deposited by electroplating in the opening. An additional silver layer is the deposited, and an anneal step is undertaken so that the copper is surrounded or encapsulated by alloy containing copper and silver. After removal of appropriate portions of the silver layers, the copper remains encapsulated or encased by copper-silver alloy.

7 Claims, 4 Drawing Sheets

METHOD OF ELECTROLESS AG LAYER FORMATION FOR CU INTERCONNECTS

BACKGROUND OF THE INVENTION

1. Field of the Invention

This invention relates generally to semiconductor devices and techniques for their manufacture, and more particularly, to semiconductor devices and manufacturing techniques for encapsulating interconnect structure that has been fabricated of copper.

2. Discussion of the Related Art

Typically, in the manufacture of high-density semiconductor devices, multiple layers of conductive material connected by vias or plugs are provided above a substrate. Such multiple layers, typically of metal, are employed in order to accommodate high device densities. While aluminum has been used mainly in the past for metallization within integrated circuits, as metal lines are scaled down to smaller dimensions (including decreasing widths), the problem of failure due to electromigration, which may lead to open or shorted metal lines, has become significant. Additionally, as dimensions of metal lines further decrease, metal line resistance increases, and this increase may adversely affect circuit performance.

Presently, the use of copper in interconnect structure is receiving great attention, because copper has lower bulk resistivity than aluminum and potentially higher electromigration tolerance than aluminum.

With damascene dimensions of conductors decreasing below 0.1 micron in width or diameter, the aspect ratio of a copper interconnect may well exceed 5:1. In such a situation, when forming a copper interconnect by electroplating, a highly conformal and low-resistivity base layer is needed prior to such formation. A currently used ion metal plasma (IP) base layer contains both a high resistivity barrier layer (for example Ta or TaN) and a copper seed layer with relatively high resistance (due to the effect of increased thin-film resistance with decreasing thickness), leading to circuit performance problems as discussed above. Furthermore, such a base later has low conformality and extendability when applied to small features, so that voids are readily formed in high aspect ratio trench/vias.

Therefore, what is needed is a method for providing high conformality of a base layer in a copper electroplating process, meanwhile providing for high conductivity and high electromigration resistance of the copper metallization.

SUMMARY OF THE INVENTION

A dielectric layer is provided over a metal line and has via opening which communicates with the metal line. A layer of silver is deposited over the structure and into the via opening, providing close conformance within the opening. A resist layer is provided over the resulting structure and a trench opening is provided therein which communicates with the via opening defined by the dielectric layer. Copper is then deposited by electroplating in the trench/via openings, and the resist material is removed, leaving some of the copper extending beyond the dielectric layer. Another layer of silver is deposited over the resulting structure, providing close conformance with the extended portion of the copper, and in contact with extended portions of the first-mentioned silver layer. An anneal operation is undertaken, and portions of the silver layers are selectively removed, leaving a copper trench/via structure encapsulated by copper-silver alloy.

As an alternative, after formation of a trench/via opening in a dielectric layer, a seed layer containing palladium is formed on the dielectric surface in the opening prior to deposition of the silver layer in the opening. Then, copper is deposited by electroplating, and after a chemical mechanical polish of metals from the dielectric surface, a seed layer containing palladium is formed only over exposed metal surfaces. Next, a silver layer is deposited only over exposed metal surfaces, and an anneal step is undertaken so that the copper trench/via structure is encapsulated by copper-silver alloy.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

DETAILED DESCRIPTION

Reference is now made in detail to specific embodiments of the present invention which illustrate the best mode presently contemplated by the inventor for practicing the invention.

Figure 1:
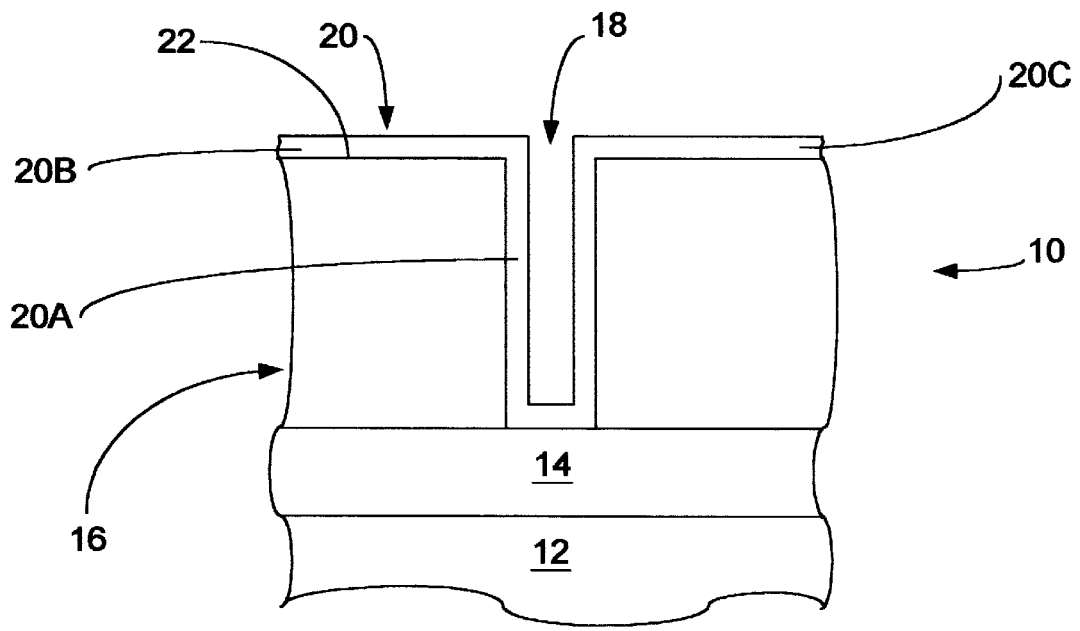
FIG. 1 is a cross-sectional view of a semiconductor device showing a conductive layer overlying a dielectric layer in which a via opening is formed, and on which a silver layer has been deposited.

Shown in FIG. 1 is a semiconductor structure 10 having a low k dielectric substrate 12 on which a conductive layer 14, typically metal such as copper (Cu), is disposed. A low k dielectric layer 16 is provided over the metal layer 14, and through appropriate masking and etching of the dielectric layer 16, a via opening 18 of high aspect ratio, in accordance with current practice, is formed in the dielectric layer 16. This opening 18 communicates with the metal layer 14 under the dielectric layer 16. Next, a layer of silver (Ag) 20 is deposited over the resulting structure, having a portion 20A within the opening 18 in the dielectric layer 16, i.e., on the sidewalls and in contact with the metal layer 14, and on the top surface 22 of the dielectric layer 16. The provision of this silver layer 20 may be undertaken by in a variety of ways, for example, by physical vapor deposition (PVD), chemical vapor deposition (CVD), atomic layer deposition, or electroless deposition. An example of electroless deposition of the silver layer 20 will now be described:

After formation of the dielectric layer 16 on the metal layer 14, and etching of the via opening 18 therein,
 a) immersion of the structure in a solution containing surfactant and $H_2O$ for 2–15 seconds for wetting of the low k dielectric 16 surface;
 b) application of electroless silver solution for 15–60 seconds at 10–25° C., the composition of such solution being

| | |
|---|---|
| $AgNO_3$ | 10–70 mg/l |
| Ethylenediamine | 0.1–0.3 g/l |
| (or Ethylenediamine tetraacetic acid) | |
| KOH (or tetramethyl ammonium hydroxide) | 40–70 mg/l |
| Formaldehyde HCOH (or glyoxalic acid) | 0.2–0.5 ml/l |
| Additives (surfactants) | 0.01–0.05 ml/l; | c) Rinsing in $H_2O$ and drying.

The silver layer 20 is continuous and highly conformal to the dielectric 16, and has a thickness of for example 100–300 angstroms.

Next, annealing of the silver 20 is undertaken at 100–200° C. to reduce the resistance thereof from approximately 3 $\mu$ohms.cm. to approximately 1.6 $\mu$ohms.cm.

Figure 2:
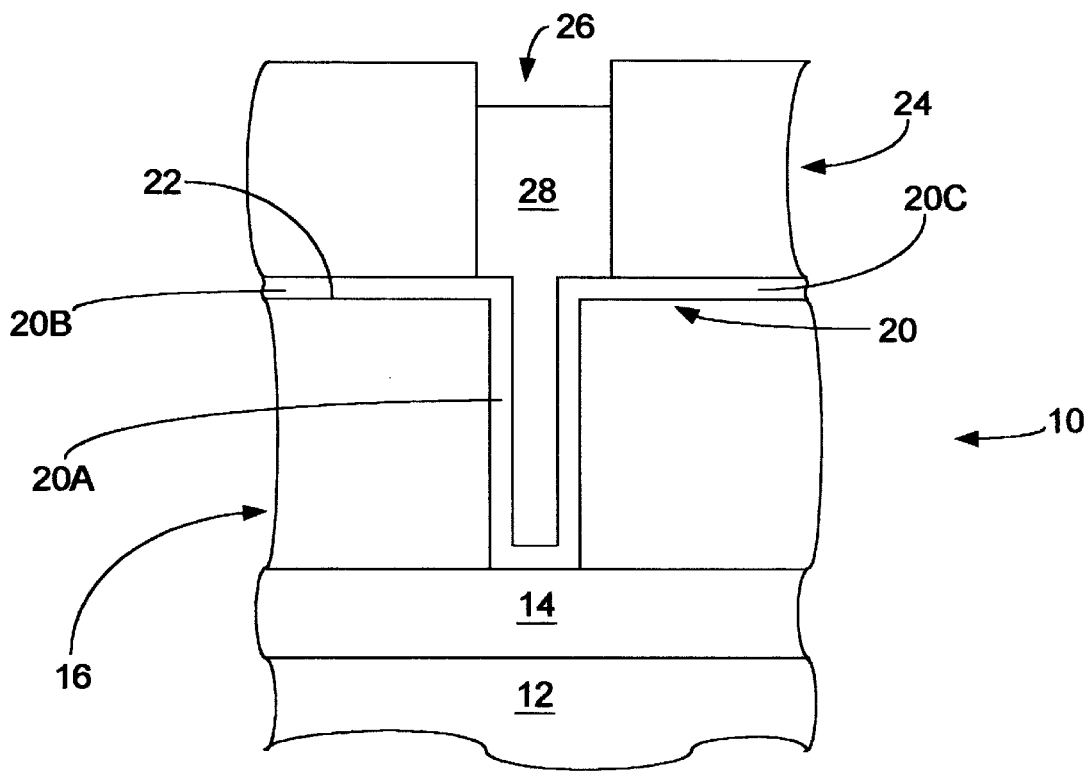
FIG. 2 is a cross-sectional view similar to that shown in FIG. 1 but showing a pattered photoresist layer over the structure of FIG. 1 so as to define a trench opening communicating with the via opening, and further showing copper deposited by electroplating in such opening.
Figure 3:
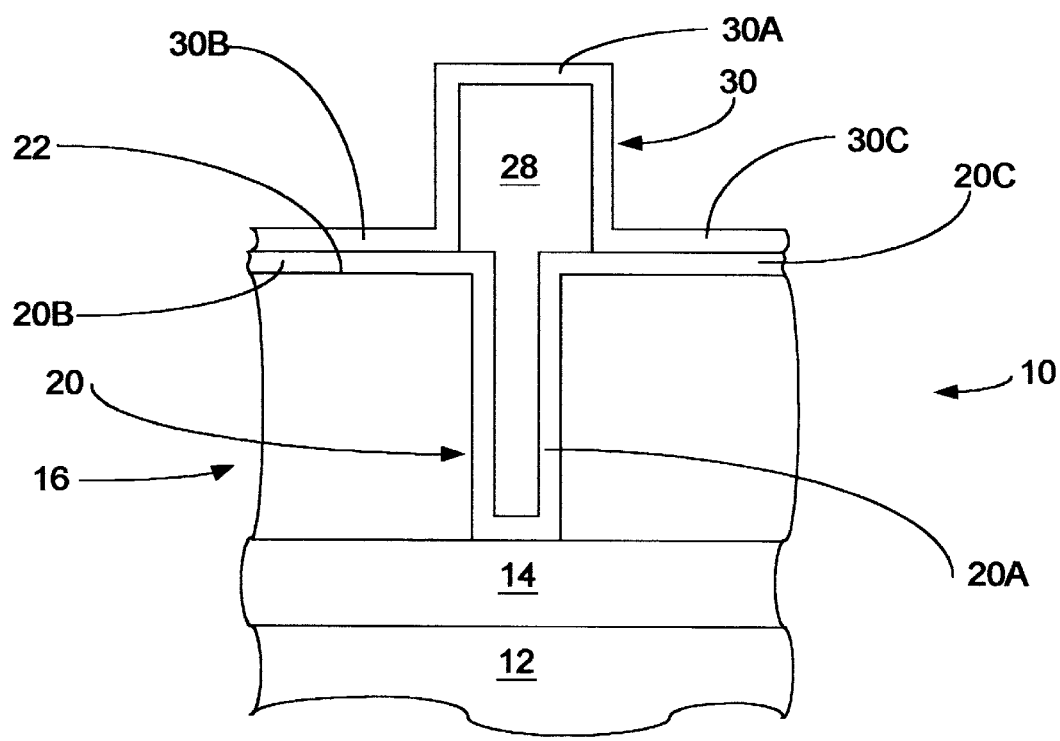
FIG. 3 is a cross-sectional view similar to that shown in FIG. 2 but showing the photoresist removed and an additional layer of silver deposited over the resulting structure.
Figure 4:
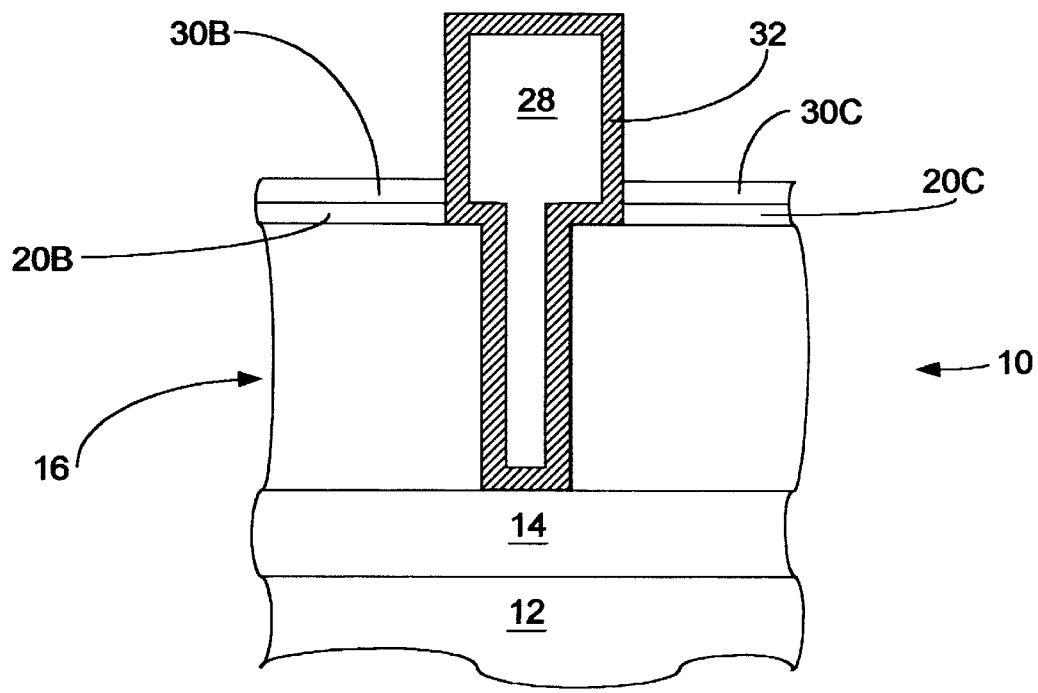
FIG. 4 is a cross-sectional view similar to that shown in FIG. 3, illustrating the anneal step of the present invention.

With reference to FIG. 2, a layer of photoresist 24 is provided over the resulting structure, and standard lithographic techniques are used to form a trench opening 26 in the resist 24 which communicates with the via opening 18 in the dielectric layer 16. Thereafter, a selective copper electroplating process is undertaken to deposit copper 28 in the trench/via openings, to form a copper interconnect structure 28. After removal of the resist layer 24, which leaves a portion of the copper interconnect structure 28 extending above the surface 22 of the dielectric layer 16 (FIG. 3), a layer of silver 30 is electrolessly deposited over the resulting structure in the manner described above, having a portion 30A over the exposed portion of the copper interconnect structure 28, and portions 30B, 30C overlying the portions 20B, 20C of the silver layer 20 on the dielectric layer 16. At this point, the copper interconnect structure 28 is encapsulated or encased in silver.

An anneal step is then undertaken, for example at a temperature of 250–450° C., so that a copper-silver alloy 32 is formed at the interface or boundary of the copper and silver. The causes the copper interconnect structure 28 to be encapsulated by copper-silver alloy 32.

Figure 5:
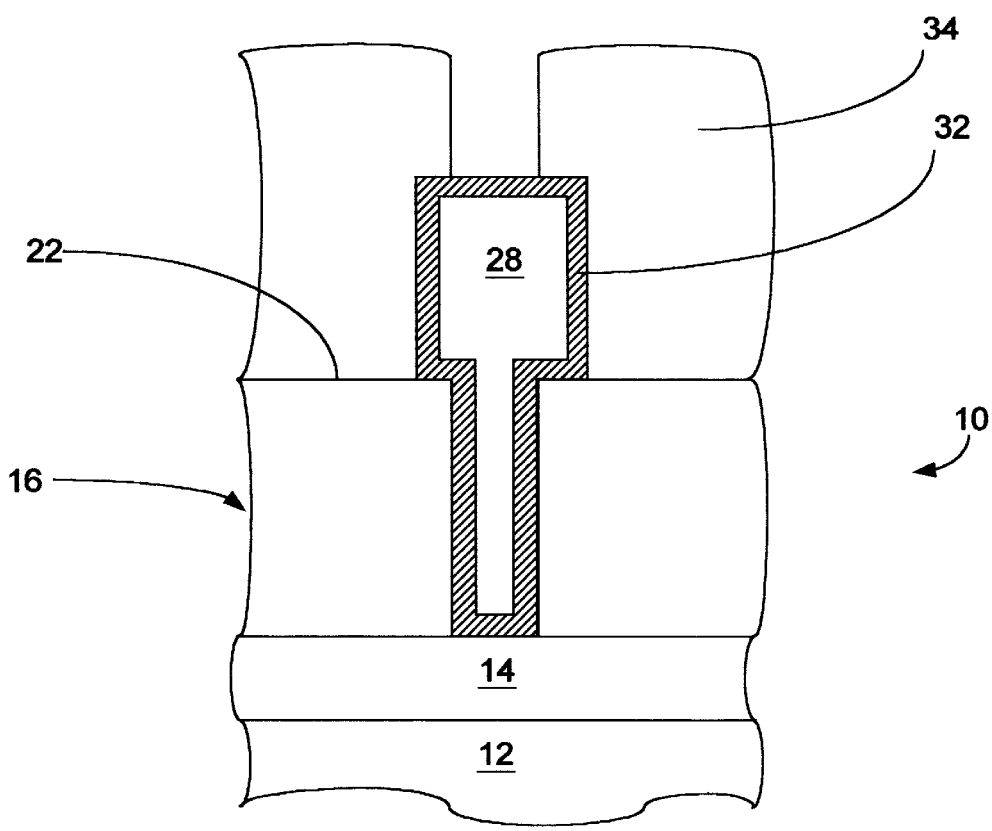
FIG. 5 is a cross-sectional view similar to that shown in FIG. 4 but showing removal of portions of the silver layers and addition of another dielectric layer.

With reference to FIG. 5, after selective removal of portions 20B, 20C, 30B, 30C of the silver layers 20, 30 overlying the surface 22 of the dielectric layer 16, an additional dielectric layer 34 is deposited over the resulting structure, and standard lithographic and etching techniques are used to form a via opening 36 in the dielectric layer 34. It will readily be seen that further steps will be undertaken in the formation of a complete semiconductor structure.

Advantages of the use of silver as a conductor are discussed in "Silver Metallization for Advanced Interconnects", Manepalli et al., IEEE Transactions on Advanced Packaging, Vol.22, No.1, February 1999.

The silver layers 20, 30 have high conformality, readily lending themselves to use in trench/via openings which have a high aspect ratio. Furthermore, the silver layer 20 serves as a seed layer for electroplating copper in very small geometries of trench/vias. The copper-silver alloy layer 32 encapsulating the copper interconnect 28 increases electromigration resistance of the copper interconnect 28 by restriction of copper diffusion at the interface of the copper with other materials. The copper-silver alloy 32 has a low resistance characteristic which does not increase the resistance of the copper interconnect 28.

Figure 6:
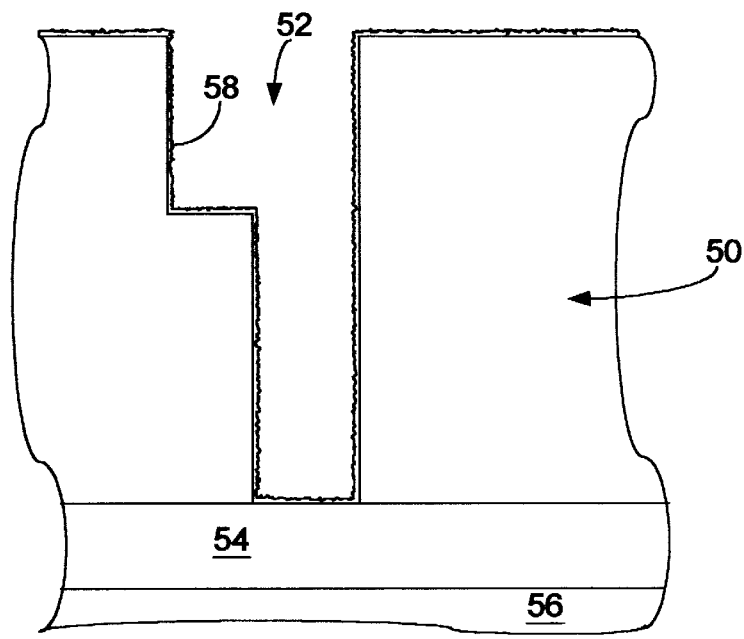
FIG. 6 is a cross-sectional view of a second embodiment of the invention, showing a dielectric layer having a trench/via opening which communicates with a metal layer, and showing a seed layer containing palladium applied to the dielectric within the opening.
Figure 7:
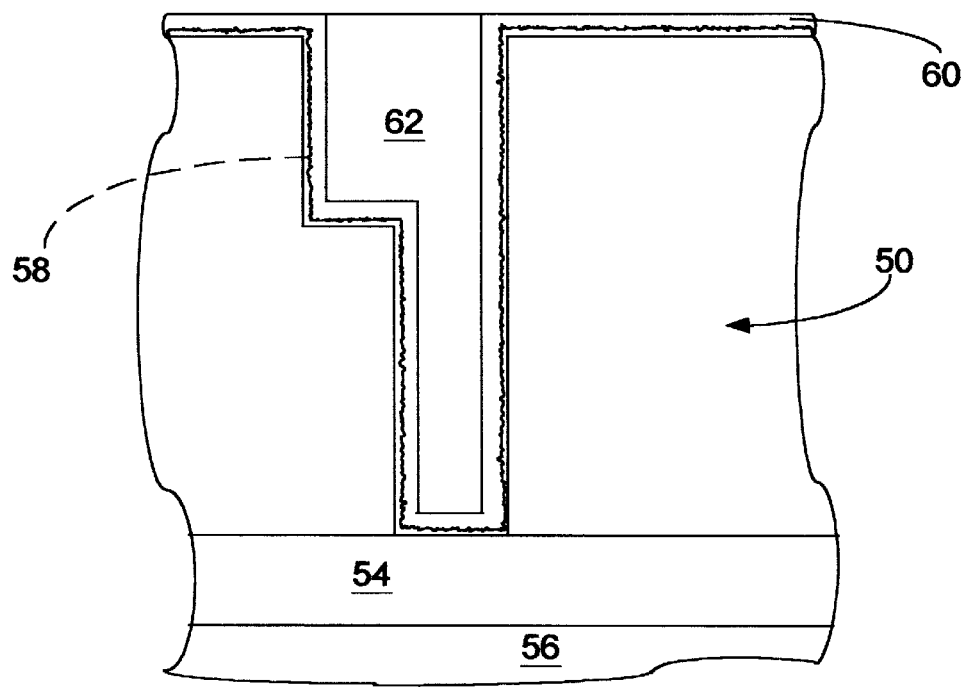
FIG. 7 is a cross-sectional view similar to that shown in FIG. 6 and showing a layer of silver applied over the resulting structure, and copper deposited by electroplating in the opening.
Figure 8:
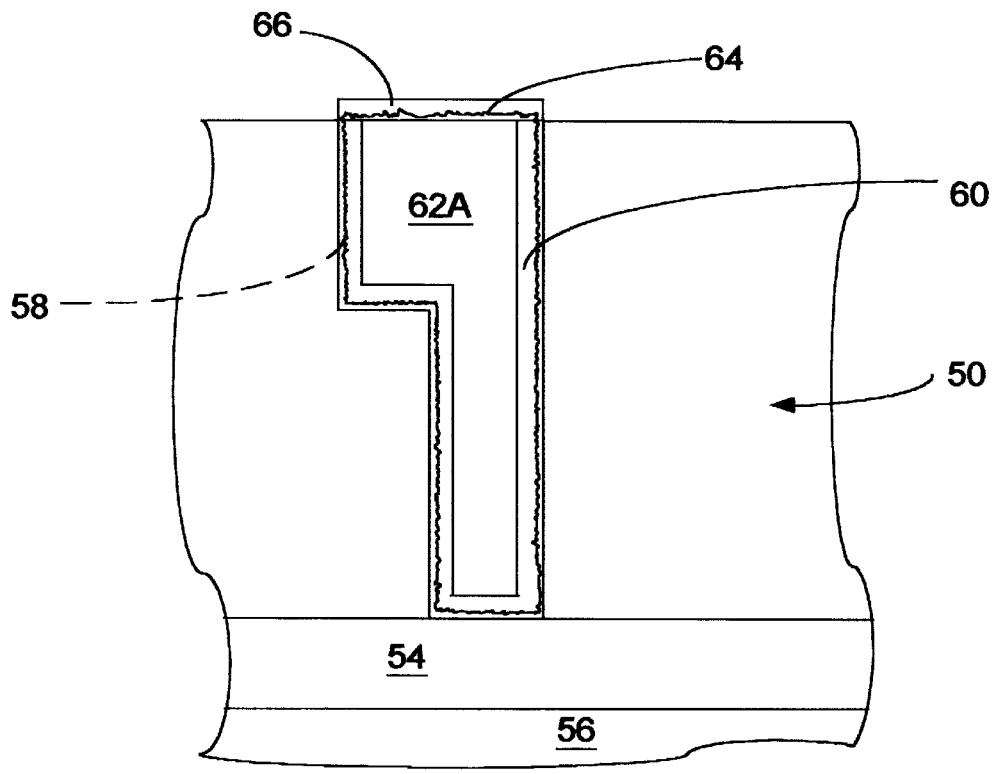
FIG. 8 is a cross-sectional view similar to that shown in FIG. 7 showing a seed layer containing palladium and an additional layer of silver on the exposed metal shown in FIG. 7.

As of alternative, reference is made to FIGS. 6–8. As shown therein, a dual damascene via/trench formation of a low k dielectric layer 50 is undertaken by standard photolithographic and etching techniques, so that a trench/via opening 52 is provided in the dielectric layer 50 communicating with a bottom metallization layer 54 of copper disposed on a low k dielectric substrate 56. A seed layer 58 containing palladium is formed on the surface of the dielectric 50, in particular in the opening 52, by immersion in for example an aqueous contact activation solution containing the following:

| | |
|---|---|
| $SnCl_2$ | 1–30 grams/liter |
| $PdCl_2$ | 0.02–5 ml./liter |
| HCl | 0.5–7 ml./liter |
| HF (49)% | 1–40 ml./liter |

The conditions for activating the seed layer are as follows:

| | |
|---|---|
| Temperature | 18–25° C. |
| pH | 1–3 |
| Time | 3–60 seconds |

A seed layer 10–30 angstroms thick containing palladium is formed, and then a silver layer 60 is deposited over the resulting structure (FIG. 6) by application of silver-electroless solution as described above. This results in formation of a silver layer 60 100–300 angstroms thick, which is continuous and highly conformal to the trench/via opening 52.

Then, a bulk copper layer 62 is deposited by copper electroplating in a standard solution. After chemical mechanical polishing (CMP) of metals from the dielectric 50 surface, bringing the top surface of the copper 62 to the level of the surface of the dielectric 50, and forming copper interconnect structure 62A, another seed layer 64 is formed to a thickness of 10–30 angstroms, using the same solution as described above, with low concentration of metal ions, only over the exposed metal surfaces of the copper interconnect structure 62A. Then, a layer of silver 66 is electrolessly deposited, using a solution with low concentration of silver ions and formaldehyde (or glyoxalic acid) only on the exposed metal surfaces, as described above, the layer 64 acting as a seed layer for the deposition of the silver 66. An anneal step is undertaken similar to that described in the previous embodiment, so that a copper-silver alloy is formed which encapsulates the interconnect 62A.

The present methods readily lend themselves to sub-0.1 micron metallization features with high aspect ratios, for example, 5:1 or greater. It will be noted that the present methods do not use metallic barrier layers against copper or silver diffusion which would increase resistivity of a copper interconnect with such small dimensions. The low k dielectric serves as a barrier against copper or silver diffusion i.e., for example, benzocyclobutene (BCB) type dielectric. Furthermore, if desired, a conformal dielectric barrier, for example silicon nitride, can be deposited on the dielectric prior to application of the silver layer, if this is considered desirable for protection of active devices from copper or silver diffusion.

As will be seen, the methods disclosed above provide for high conformity of a base layer in a copper electroplating process, so that such methods can readily be applied to formation of interconnects with a high aspect ratio. The low resistivity silver or copper-silver alloy at the copper/dielectric interface leads to high electromigration resistance and high conductivity of the copper metallization.

The foregoing description of the embodiment of the invention has been presented for purposes of illustration and description. It is not intended to be exhaustive or to limit the invention to the precise form disclosed. Other modifications or variations are possible in light of the above teachings. The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled

What is claimed is:

1. A semiconductor structure comprising:

a dielectric layer having an opening therein;

a layer comprising silver in the opening in the dielectric layer; and a conductor comprising copper in the opening on the layer comprising silver;

the structure excluding a metallic barrier layer.

2. The semiconductor structure of claim 1 wherein the layer comprising silver comprises silver-copper alloy.

3. The device of claim 1 and further comprising an additional layer comprising silver over the copper so that the copper is encapsulated by the layers comprising silver.

4. The semiconductor structure of claim 1 wherein the layer comprising silver comprises silver-copper-palladium alloy.

5. The semiconductor structure of claim 1 and further comprising a conductive layer, the dielectric layer being over the conductive layer, the opening in the dielectric layer communicating with the conductive layer.

6. The semiconductor structure of claim 3 and further comprising a conductive layer, the dielectric layer being over the conductive layer, the opening in the dielectric layer communicating with the conductive layer.

7. a semiconductor structure comprising:

a dielectric layer having an opening therein;

a layer comprising palladium in the opening and on and in contact with the dielectric layer;

a layer comprising silver in the opening on the layer comprising palladium; and a conductor comprising copper in the opening on the layer comprising silver.

* * * * *